United States Patent
Hisano et al.

(10) Patent No.: US 9,393,720 B2
(45) Date of Patent: Jul. 19, 2016

(54) POLYIMIDE FILM AND PROCESS FOR PRODUCING POLYIMIDE FILM

(75) Inventors: Nobuharu Hisano, Ube (JP); Taizou Murakami, Ube (JP); Masafumi Kohda, Ichihara (JP); Hiroaki Yamaguchi, Ube (JP)

(73) Assignee: UBE INDUSTRIES, LTD., Ube-Shi (JP)

( * ) Notice: Subject to any disclaimer, the term of this patent is extended or adjusted under 35 U.S.C. 154(b) by 551 days.

(21) Appl. No.: 13/391,011

(22) PCT Filed: Aug. 18, 2010

(86) PCT No.: PCT/JP2010/063925
§ 371 (c)(1),
(2), (4) Date: Mar. 6, 2012

(87) PCT Pub. No.: WO2011/021639
PCT Pub. Date: Feb. 24, 2011

(65) Prior Publication Data
US 2012/0156482 A1      Jun. 21, 2012

(30) Foreign Application Priority Data

Aug. 20, 2009 (JP) ................. 2009-191092

(51) Int. Cl.
| | |
|---|---|
| *B29C 39/14* | (2006.01) |
| *B29C 41/24* | (2006.01) |
| *C08G 73/10* | (2006.01) |
| *C08J 7/02* | (2006.01) |
| *B29C 71/02* | (2006.01) |
| *C08L 79/08* | (2006.01) |
| *H05K 3/38* | (2006.01) |
| *B29K 79/00* | (2006.01) |
| *H05K 1/03* | (2006.01) |

(52) U.S. Cl.
CPC ............ *B29C 41/24* (2013.01); *C08G 73/1067* (2013.01); *C08J 7/02* (2013.01); *C08J 7/08* (2013.01); *C08L 79/08* (2013.01); *H05K 3/381* (2013.01); *B29K 2079/08* (2013.01); *H05K 1/0346* (2013.01); *H05K 2201/0154* (2013.01); *H05K 2203/0793* (2013.01); *Y10T 428/28* (2015.01)

(58) Field of Classification Search
CPC ............................. B29C 39/003; B29C 39/14
USPC ....................................................... 264/212
See application file for complete search history.

(56) References Cited

U.S. PATENT DOCUMENTS

| | | | |
|---|---|---|---|
| 4,797,307 A | 1/1989 | Kunimoto et al. | |
| 6,217,996 B1 | 4/2001 | Yamamoto et al. | |
| 6,218,022 B1 * | 4/2001 | Suzuki et al. | 428/457 |
| 6,264,866 B1 * | 7/2001 | Yamada et al. | 264/216 |
| 2004/0071992 A1 | 4/2004 | Zinbo et al. | |
| 2008/0299402 A1 | 12/2008 | Kawaguchi et al. | |

FOREIGN PATENT DOCUMENTS

| | | |
|---|---|---|
| JP | 62-267330 | 11/1987 |
| JP | 06-005997 | 1/1994 |
| JP | 07-330930 | 12/1995 |
| JP | 11-000930 | 1/1999 |
| JP | 2000-239423 | 9/2000 |
| JP | 2006-056956 | 3/2006 |
| JP | 2007-009186 | 1/2007 |
| JP | 2008-031470 | 2/2008 |

OTHER PUBLICATIONS

Notification of Transmittal of Translation of the International Preliminary Report on Patentability mailed Mar. 15, 2012, and English translation of the International Preliminary Report on Patentability, issued in PCT/JP2010/063925.

Office Action in Taiwanese Patent Application No. 099127719, mailed Jun. 5, 2015.

* cited by examiner

*Primary Examiner* — Galen Hauth
(74) *Attorney, Agent, or Firm* — Knobbe Martens Olson & Bear LLP

(57) ABSTRACT

A polyimide film, which is produced by the reaction of a tetracarboxylic acid component comprising 3,3',4,4'-biphenyltetracarboxylic dianhydride as the main component and a diamine component comprising p-phenylenediamine as the main component, is heated at a temperature of from 460° C. to 550° C., and then water or an alkaline aqueous solution is sprayed on a surface of the polyimide film for surface treatment, thereby improving adhesiveness, while maintaining the excellent properties inherent in the polyimide film.

5 Claims, No Drawings

POLYIMIDE FILM AND PROCESS FOR PRODUCING POLYIMIDE FILM

This application is the U.S. National Phase under 35 U.S.C. §371 of International Application No. PCT/JP2010/063925, filed Aug. 18, 2010, designating the U.S., and published in Japanese as WO2011/021639 on Feb. 24, 2011, which claims priority to Japanese Patent Application No. 2009-191092, filed Aug. 20, 2009, the entire contents of which are incorporated herein by reference.

TECHNICAL FIELD

The present invention relates to a polyimide film having improved adhesiveness. The present invention also relates to a process for producing a polyimide film in which adhesive properties of the polyimide film may be easily improved.

BACKGROUND ART

A polyimide film has been widely used in various applications such as the electric/electronic device field and the semiconductor field, because it has excellent heat resistance, chemical resistance, mechanical strength, electric properties, dimensional stability and so on. For example, a copper-clad laminate wherein a copper foil is laminated on one side or both sides of a polyimide film is used for a flexible printed circuit board (FPC).

One example of the polyimide films suitable as films for FPC, for example, is a polyimide film prepared from an aromatic tetracarboxylic acid component comprising 3,3',4,4'-biphenyltetracarboxylic dianhydride as the main component and an aromatic diamine component comprising p-phenylenediamine as the main component by thermal imidization (See Patent document 1, for example.).

Meanwhile, in general, a polyimide film may not have adequate adhesiveness. When a metal foil such as a copper foil is bonded onto a polyimide film via a heat-resistant adhesive such as an epoxy resin adhesive, the obtained laminate may not have sufficiently high peel strength.

For example, Patent document 1 discloses a process for producing a polyimide film wherein a surface treatment solution containing a heat-resistant surface treating agent (coupling agent) is applied to a surface of a self-supporting film (solidified film) of a polyimide precursor solution so as to improve adhesive properties of the obtained polyimide film. There is a need for a polyimide film having excellent adhesive properties, which may be produced without applying a coupling agent onto a self-supporting film as described in Patent document 1.

Patent document 2 discloses a process for producing a polyimide film, which allows improvements in adhesiveness of the obtained polyimide film, comprising steps of:

flow-casting a composition comprising a solution of a polyimide precursor in an organic solvent, and heating the composition to form a pre-film, which preferably has an imidization rate of 70% or higher and a volatile content of 40 wt % or less; and heating the pre-film at a temperature of from 450° C. to 630° C., more preferably at a temperature of from 520° C. to 580° C., to provide a polyimide film.

As for the polyimide to which the invention is applied, in Examples, polyimide films were prepared by chemical cure, or a combination of chemical cure and thermal cure, from pyromellitic dianhydride as an aromatic tetracarboxylic dianhydride and 4,4'-diaminodiphenyl ether, or alternatively 4,4'-diaminodiphenyl ether and p-phenylenediamine, as an aromatic diamine. In addition, Patent document 2 teaches that a polyimide film, which is produced by a conventional method as an end-product, may be heated at a temperature of from 450° C. to 630° C.

An alkali treatment has been also proposed as a method for improving adhesive properties of a polyimide film. For example, Patent document 3 discloses a polyimide film, which has a surface treated with an alkaline aqueous solution containing a permanganate and a hydroxide such as potassium hydroxide and sodium hydroxide, and may be bonded to a metal foil via a polyimide adhesive with high adhesiveness. In Examples, a commercially available non-thermoplastic polyimide film was immersed in an aqueous solution containing potassium permanganate and sodium hydroxide at 75° C. for 5 min. In addition, as a means for treatment of a polyimide film surface with an alkaline aqueous solution, Patent document 3 teaches that an alkaline aqueous solution may be sprayed on a polyimide film by means of a sprayer or a shower.

Incidentally, Patent document 4 discloses a process for producing a polyimide film, comprising steps of:

forming a film by flow-casting from a solution containing a polyamic acid and a catalytic compound;

immersing the film in water preferably at a temperature of 5° C. to 100° C. for 30 min to 100 hr. so as to remove the remaining catalytic compound and the solvent from the film; and drying the film.

CITATION LIST

Patent Document

Patent document 1: JP-A-S62-267330
Patent document 2: JP-A-H11-930
Patent document 3: JP-A-2007-9186
Patent document 4: JP-A-2006-56956

SUMMARY OF INVENTION

Problems to be Solved by the Invention

An objective of the present invention is to provide a polyimide film having adhesiveness improved by a simple method, while maintaining the excellent properties inherent in the polyimide film.

Particularly, an objective of the present invention is to provide a polyimide film having adhesiveness improved by a simple method, which may be used as a substrate or a cover member for a circuit board.

Means for Solving the Problems

The present invention relates to the following items.

[1] A polyimide film produced by the reaction of a tetracarboxylic acid component comprising 3,3',4,4'-biphenyltetracarboxylic dianhydride as the main component and a diamine component comprising p-phenylenediamine as the main component; wherein the polyimide film is subjected to heat treatment in which the polyimide film is heated at a temperature of from 460° C. to 550° C., and surface treatment in which water or an alkaline aqueous solution is sprayed on a surface of the polyimide film.

[2] A polyimide film as described in [1], wherein the alkaline aqueous solution contains sodium hydroxide and/or sodium carbonate.

[3] An adhesive-laminated polyimide film, comprising a polyimide film as described in [1] or [2], and an adhesive layer which is laminated on the treated surface of the polyimide film on which water or an alkaline aqueous solution is sprayed.

[4] A process for producing a polyimide film, comprising steps of; flow-casting a solution of a polyamic acid or a polyimide, which is prepared by reacting a tetracarboxylic acid component comprising 3,3',4,4'-biphenyltetracarboxylic dianhydride as the main component and a diamine component comprising p-phenylenediamine as the main component, on a support, and drying the solution to form a self-supporting film;

heating the self-supporting film to provide a polyimide film;

heating the obtained polyimide film at a temperature of from 460° C. to 550° C.; and spraying water or an alkaline aqueous solution on a surface of the heat-treated polyimide film.

Effect of the Invention

According to the present invention, a polyimide film, which is produced by the reaction of a tetracarboxylic acid component comprising 3,3',4,4'-biphenyltetracarboxylic dianhydride as the main component and a diamine component comprising p-phenylenediamine as the main component, is heated at a temperature of from 460° C. to 550° C., preferably at a temperature equal to or higher than 460° C. and lower than 520° C. Subsequently, water or an alkaline aqueous solution is sprayed on a surface of the heat-treated polyimide film for surface treatment (spray treatment). These treatments may improve adhesiveness of the polyimide film. In addition, adhesiveness after heat treatment, e.g. adhesiveness after heat treatment at 150° C. for 24 hr., as well as initial adhesiveness (adhesiveness before heat treatment) may be improved. The polyimide film of the present invention may exhibit excellent adhesiveness to an adhesive, particularly excellent adhesiveness to an adhesive such as an epoxy adhesive and an acrylic adhesive.

In the present invention, water or an alkaline aqueous solution should be sprayed on a surface of a polyimide film. When a polyimide film is immersed in water or an alkaline aqueous solution, adhesiveness after heat treatment is apt to be lower, although initial adhesiveness (adhesiveness before heat treatment) may be improved.

DESCRIPTION OF EMBODIMENTS

The polyimide film of the present invention is prepared by the reaction of a tetracarboxylic acid component comprising 3,3',4,4'-biphenyltetracarboxylic dianhydride as the main component, and a diamine component comprising p-phenylenediamine as the main component.

The polyimide film to be used in the present invention may be produced by thermal imidization and/or chemical imidization.

Examples of the process for producing the polyimide film of the present invention include (1) a process comprising steps of;

flow-casting a polyamic acid solution, or a polyamic acid solution composition which is prepared by adding, as necessary, an imidization catalyst, an organic phosphorous-containing compound, an inorganic fine particle and the like to a polyamic acid solution, in the form of a film on a support;

heating and drying the solution or the composition to form a self-supporting film; and thermally dehydrative cyclizing the polyamic acid and removing the solvent to provide a polyimide film; and (2) a process comprising steps of;

flow-casting a polyamic acid solution composition which is prepared by adding a cyclization catalyst and a dehydrating agent, and, as necessary, an inorganic fine particle and the like to a polyamic acid solution, in the form of a film on a support;

chemically dehydrative cyclizing the polyamic acid, and, as necessary, heating and drying the composition to form a self-supporting film; and heating the self-supporting film for removing the solvent and imidizing to provide a polyimide film.

One example of the process for producing the polyimide film of the present invention is as follows. Firstly, a polyamic acid, which is a polyimide precursor, is synthesized by reacting a tetracarboxylic acid component and a diamine component in an organic solvent. And then, the solution of the polyamic acid thus obtained is flow-cast on a support, and heated and dried to form a self-supporting film. Subsequently, the self-supporting film is heated to effect imidization, thereby producing a polyimide film. Alternatively, a polyimide, which is soluble in an organic solvent, is synthesized by reacting a tetracarboxylic acid component and a diamine component in an organic solvent, and then the solution of the polyimide thus obtained is used for the production of a self-supporting film.

The polyimide precursor (polyamic acid or polyimide) to be used in the present invention is prepared from a tetracarboxylic acid component comprising 3,3',4,4'-biphenyltetracarboxylic dianhydride (hereinafter, sometimes abbreviated as "s-BPDA") as the main component, and a diamine component comprising p-phenylenediamine (hereinafter, sometimes abbreviated as "PPD") as the main component. More specifically, a tetracarboxylic acid component may preferably comprise 50 mol % or more, more preferably 80 mol % or more, particularly preferably 90 mol % or more of s-BPDA, and a diamine component may preferably comprise 50 mol % or more, more preferably 80 mol % or more, particularly preferably 90 mol % or more of PPD, because the polyimide film obtained may have excellent mechanical properties and be suitably used as various substrate, including a substrate for a circuit board.

In addition to s-BPDA and PPD, other tetracarboxylic dianhydride(s) and other diamine(s) may be used, as long as the characteristics of the present invention would not be impaired.

Specific examples of the other tetracarboxylic dianhydride may include pyromellitic dianhydride, 2,3,3',4'-biphenyltetracarboxylic dianhydride (a-BPDA), oxydiphthalic dianhydride, diphenyl sulfone-3,4,3',4'-tetracarboxylic dianhydride, bis(3,4-dicarboxyphenyl)sulfide dianhydride, 2,2-bis(3,4-dicarboxyphenyl)-1,1,1,3,3,3-hexafluoropropane dianhydride, 2,3,3',4'-benzophenone tetracarboxylic dianhydride, 3,3',4,4'-benzophenone tetracarboxylic dianhydride, bis(3,4-dicarboxyphenyl)methane dianhydride, 2,2-bis(3,4-dicarboxyphenyl)propane dianhydride, p-phenylene bis(trimellitic acid monoester anhydride), p-biphenylene bis(trimellitic acid monoester anhydride), m-terphenyl-3,4,3',4'-tetracarboxylic dianhydride, p-terphenyl-3,4,3',4'-tetracarboxylic dianhydride, 1,3-bis(3,4-dicarboxyphenoxy)benzene dianhydride, 1,4-bis(3,4-dicarboxyphenoxy)benzene dianhydride, 1,4-bis(3,4-dicarboxyphenoxy)biphenyl dianhydride, 2,2-bis[(3,4-dicarboxyphenoxy)phenyl]propane dianhydride, 2,3,6,7-naphthalene tetracarboxylic dianhydride, 1,4,5,8-naphthalene tetracarboxylic dianhydride, and 4,4'-(2,2-hexafluoroisopropylidene)diphthalic dianhydride. An aromatic tetracarboxylic acid such as 2,3,3',4'-diphenyl sulfone tetracarboxylic acid may be also preferably used. These may be used alone or in combination of two or more. A tetracarboxylic dianhydride used in the present invention may be appropriately selected depending on the desired properties, and the like.

Specific examples of the other diamine may include 1) diamines having one benzene ring such as 1,3-diaminobenzene;

2) diamines having two benzene rings such as 4,4'-diaminodiphenyl ether, 3,4'-diaminodiphenyl ether, 4,4'-diaminodiphenylmethane, 3,3'-dimethyl-4,4'-diaminobiphenyl, 2,2'-dimethyl-4,4'-diaminobiphenyl, 2,2'-bis(trifluoromethyl)-4,4'-diaminobiphenyl, 3,3'-dimethyl-4,4'-diaminodiphenylmethane, 3,3'-dicarboxy-4,4'-diaminodiphenylmethane, 3,3',5,5'-tetramethyl-4,4'-diaminodiphenylmethane, bis(4-aminophenyl)sulfide, 4,4'-diaminobenzanilide, 3,3'-dichlorobenzidine, 3,3'-dimethylbenzidine, 2,2'-dimethylbenzidine, 3,3'-dimethoxybenzidine, 2,2'-dimethoxybenzidine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenyl sulfone, 3,4'-diaminodiphenyl sulfone, 4,4'-diaminodiphenyl sulfone, 3,3'-diaminobenzophenone, 3,3'-diamino-4,4'-dichlorobenzophenone, diamino-4,4'-dimethoxybenzophenone, 3,3'-diaminodiphenylmethane, 3,4'-diaminodiphenylmethane, 4,4'-diaminodiphenylmethane, 2,2-bis(3-aminophenyl)propane, 2,2-bis(4-aminophenyl)propane, 2,2-bis(3-aminophenyl)-1,1,1,3,3,3-hexafluoropropane, 2,2-bis(4-aminophenyl)-1,1,1,3,3,3-hexafluoropropane, 3,3'-diaminodiphenyl sulfoxide, 3,4'-diaminodiphenyl sulfoxide, and 4,4'-diaminodiphenyl sulfoxide;

3) diamines having three benzene rings such as 1,3-bis(3-aminophenyl)benzene, 1,3-bis(4-aminophenyl)benzene, 1,4-bis(3-aminophenyl)benzene, 1,4-bis(4-aminophenyl)benzene, 1,3-bis(4-aminophenoxy)benzene, 1,4-bis(3-aminophenoxy)benzene, 1,4-bis(4-aminophenoxy)benzene, 1,3-bis(3-aminophenoxy)-4-trifluoromethylbenzene, 3,3'-diamino-4-(4-phenyl)phenoxybenzophenone, 3,3'-diamino-4,4'-di(4-phenylphenoxy)benzophenone, 1,3-bis(3-aminophenyl sulfide)benzene, 1,3-bis(4-aminophenyl sulfide)benzene, 1,4-bis(4-aminophenyl sulfide)benzene, 1,3-bis(3-aminophenyl sulfone)benzene, 1,3-bis(4-aminophenyl sulfone)benzene, 1,4-bis(4-aminophenyl sulfone)benzene, 1,3-bis[2-(4-aminophenyl)isopropyl]benzene, 1,4-bis[2-(3-aminophenyl)isopropyl]benzene, and 1,4-bis[2-(4-aminophenyl)isopropyl]benzene; and 4) diamines having four benzene rings such as 3,3'-bis(3-aminophenoxy)biphenyl, 3,3'-bis(4-aminophenoxy)biphenyl, 4,4'-bis(3-aminophenoxy)biphenyl, 4,4'-bis(4-aminophenoxy)biphenyl, bis[3-(3-aminophenoxy)phenyl]ether, bis[3-(4-aminophenoxy)phenyl]ether, bis[4-(3-aminophenoxy)phenyl]ether, bis[4-(4-aminophenoxy)phenyl]ether, bis[3-(3-aminophenoxy)phenyl]ketone, bis[3-(4-aminophenoxy)phenyl]ketone, bis[4-(3-aminophenoxy)phenyl]ketone, bis[4-(4-aminophenoxy)phenyl]ketone, bis[3-(3-aminophenoxy)phenyl]sulfide, bis[3-(4-aminophenoxy)phenyl]sulfide, bis[4-(3-aminophenoxy)phenyl]sulfide, bis[4-(4-aminophenoxy)phenyl]sulfide, bis[3-(3-aminophenoxy)phenyl]sulfone, bis[3-(4-aminophenoxy)phenyl]sulfone, bis[4-(3-aminophenoxy)phenyl]sulfone, bis[4-(4-aminophenoxy)phenyl]sulfone, bis[3-(3-aminophenoxy)phenyl]methane, bis[3-(4-aminophenoxy)phenyl]methane, bis[4-(3-aminophenoxy)phenyl]methane, bis[4-(4-aminophenoxy)phenyl]methane, 2,2-bis[3-(3-aminophenoxy)phenyl]propane, 2,2-bis[3-(4-aminophenoxy)phenyl]propane, 2,2-bis[4-(3-aminophenoxy)phenyl]propane, 2,2-bis[4-(4-aminophenoxy)phenyl]propane, 2,2-bis[3-(3-aminophenoxy)phenyl]-1,1,1,3,3,3-hexafluoropropane, 2,2-bis[3-(4-aminophenoxy)phenyl]-1,1,1,3,3,3-hexafluoropropane, 2,2-bis[4-(3-aminophenoxy)phenyl]-1,1,1,3,3,3-hexafluoropropane, and 2,2-bis[4-(4-aminophenoxy)phenyl]-1,1,1,3,3,3-hexafluoropropane.

These may be used alone or in combination of two or more. A diamine used in the present invention may be appropriately selected depending on the desired properties, and the like.

A polyimide precursor may be synthesized by random-polymerizing or block-polymerizing substantially equimolar amounts of an aromatic tetracarboxylic dianhydride and an aromatic diamine in an organic solvent. Alternatively, two or more polyimide precursors in which either of these two components is excessive may be prepared, and subsequently, these polyimide precursor solutions may be combined and then mixed under reaction conditions. The polyimide precursor solution thus obtained may be used without any treatment, or alternatively, after removing or adding a solvent, if necessary, to prepare a self-supporting film.

Examples of an organic solvent for the polyimide precursor solution include N-methyl-2-pyrrolidone, N,N-dimethylformamide, N,N-dimethylacetamide and N,N-diethylacetamide and the like. These organic solvents may be used alone or in combination of two or more.

In the case of thermal imidization, the polyimide precursor solution may contain an imidization catalyst, an organic phosphorous-containing compound, an inorganic fine particle, and the like, as necessary.

In the case of chemical imidization, the polyimide precursor solution may contain a cyclization catalyst and a dehydrating agent, and an inorganic fine particle, and the like, as necessary.

Examples of the imidization catalyst include substituted or unsubstituted nitrogen-containing heterocyclic compounds, N-oxide compounds of the nitrogen-containing heterocyclic compounds, substituted or unsubstituted amino acid compounds, aromatic hydrocarbon compounds, and aromatic heterocyclic compounds having a hydroxyl group. Particularly preferable examples of the imidization catalyst include lower-alkyl imidazoles such as 1,2-dimethylimidazole, N-methylimidazole, N-benzyl-2-methylimidazole, 2-methylimidazole, 2-ethyl-4-methylimidazole and 5-methylbenzimidazole; benzimidazoles such as N-benzyl-2-methylimidazole; and substituted pyridines such as isoquinoline, 3,5-dimethylpyridine, 3,4-dimethylpyridine, 2,5-dimethylpyridine, 2,4-dimethylpyridine and 4-n-propylpyridine. The amount of the imidization catalyst to be used is preferably about 0.01 to 2 equivalents, particularly preferably about 0.02 to 1 equivalents relative to the amide acid unit in the polyamide acid. When an imidization catalyst is used, the polyimide film obtained may have improved properties, particularly extension and edge-cracking resistance.

Examples of the organic phosphorous-containing compound include phosphates such as monocaproyl phosphate, monooctyl phosphate, monolauryl phosphate, monomyristyl phosphate, monocetyl phosphate, monostearyl phosphate, triethyleneglycol monotridecyl ether monophosphate, tetraethyleneglycol monolauryl ether monophosphate, diethyleneglycol monostearyl ether monophosphate, dicaproyl phosphate, dioctyl phosphate, dicapryl phosphate, dilauryl phosphate, dimyristyl phosphate, dicetyl phosphate, distearyl phosphate, tetraethyleneglycol mononeopentyl ether diphosphate, triethyleneglycol monotridecyl ether diphosphate, tetraethyleneglycol monolauryl ether diphosphate, and diethyleneglycol monostearyl ether diphosphate; and amine salts of these phosphates. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine and triethanolamine.

Examples of the cyclization catalyst include aliphatic tertiary amines such as trimethylamine and triethylenediamine, aromatic tertiary amines such as dimethylaniline, and heterocyclic tertiary amines such as isoquinoline, pyridine, α-picoline and β-picoline.

Examples of the dehydrating agent include aliphatic carboxylic anhydrides such as acetic anhydride, propionic anhydride and butyric anhydride, and aromatic carboxylic anhydrides such as benzoic anhydride.

Examples of the inorganic fine particle include particulate inorganic oxide powders such as titanium dioxide powder, silicon dioxide (silica) powder, magnesium oxide powder, aluminum oxide (alumina) powder and zinc oxide powder; particulate inorganic nitride powders such as silicon nitride powder and titanium nitride powder; inorganic carbide powders such as silicon carbide powder; and particulate inorganic salt powders such as calcium carbonate powder, calcium sulfate powder and barium sulfate powder. These inorganic fine particles may be used in combination of two or more. These inorganic fine particles may be homogeneously dispersed using the known means.

A self-supporting film of a polyimide precursor solution may be prepared by flow-casting the above-mentioned solution of a polyimide precursor in an organic solvent, or a polyimide precursor solution composition which is prepared by adding an imidization catalyst, an organic phosphorous-containing compound, an inorganic fine particle, and the like to the solution, on a support; and then heating the solution or the composition to the extent that a self-supporting film is formed (which means a stage before a common curing process), for example, to the extent that the film may be peeled from the support.

There are no particular restrictions to the solid content of the polyimide precursor solution to be used in the present invention, so long as the polyimide precursor solution has a viscosity suitable for the production of a self-supporting film. In general, the solid content of the polyimide precursor solution may be preferably 10 wt % to 30 wt %, more preferably 15 wt % to 27 wt %, particularly preferably 18 wt % to 26 wt %.

In the preparation of a self-supporting film, the heating temperature and the heating time may be appropriately determined. In the case of thermal imidization, a polyimide precursor solution in the form of a film may be heated at a temperature of from 100° C. to 180° C. for about 1 min to 60 min, for example.

There are no particular restrictions to the support, so long as a polyimide precursor solution may be cast on the substrate. A substrate having a smooth surface may be suitably used. A metallic drum or belt such as a stainless drum or belt, for example, may be used as the support.

There are no particular restrictions to the self-supporting film, so long as the solvent is removed from the film and/or the film is imidized to the extent that the film may be peeled from the support. In the case of thermal imidization, it is preferred that a weight loss on heating of a self-supporting film is within a range of 20 wt % to 50 wt %, and it is further preferred that a weight loss on heating of a self-supporting film is within a range of 20 wt % to 50 wt % and an imidization rate of a self-supporting film is within a range of 8% to 55%. When a self-supporting film has a weight loss on heating within a range of 20 wt % to 50 wt % and an imidization rate within a range of 8% to 55%, the self-supporting film may have sufficient mechanical properties.

In addition, when a self-supporting film has a weight loss on heating and an imidization rate within the above-mentioned range, a coupling agent solution may be more evenly and more easily applied to the surface of the self-supporting film and no foaming, flaws, crazes, cracks and fissures are observed in the polyimide film obtained after imidizing.

The weight loss on heating of a self-supporting film may be calculated by the following formula from the weight of the self-supporting film (W1) and the weight of the film after curing (W2).

Weight loss on heating (wt %)={($W1-W2$)/$W1$}×100

The imidization rate of a self-supporting film may be calculated based on the ratio of the vibration band peak area or height in the IR spectra of a self-supporting film and the fully-cured film thereof (polyimide film), which were measured according to ATR method. The vibration band peak utilized in the procedure may be an asymmetric stretching vibration band of an imide carbonyl group and a stretching vibration band of a benzene ring skeleton. The imidization rate may be also determined in accordance with the procedure described in JP-A-H9-3161.99, using a Karl Fischer moisture meter.

According to the present invention, a solution containing a surface treatment agent such as a coupling agent and a chelating agent may be applied to one side or both sides of the self-supporting film thus obtained, as necessary.

Examples of the surface treatment agent include various surface treatment agents that improve adhesiveness or adherence, and include various coupling agents and chelating agents such as a silane-based coupling agent, a borane-based coupling agent, an aluminium-based coupling agent, an aluminium-based chelating agent, a titanate-based coupling agent, a iron-based coupling agent, and a copper-based coupling agent. A coupling agent such as a silane coupling agent may be preferably used as a surface treatment agent.

Examples of the silane-based coupling agent include epoxysilane-based coupling agents such as γ-glycidoxypropyl trimethoxy silane, γ-glycidoxypropyl diethoxy silane, and β-(3,4-epoxycyclohexyl)ethyl trimethoxy silane; vinylsilane-based coupling agents such as vinyl trichloro silane, vinyl tris(β-methoxy ethoxy)silane, vinyl triethoxy silane, and vinyl trimethoxy silane; acrylsilane-based coupling agents such as γ-methacryloxypropyl trimethoxy silane; aminosilane-based coupling agents such as N-β-(aminoethyl)-γ-aminopropyl trimethoxy silane, N-β-(aminoethyl)-γ-aminopropylmethyl dimethoxy silane, γ-aminopropyl triethoxy silane, and N-phenyl-γ-aminopropyl trimethoxy silane; γ-mercaptopropyl trimethoxy silane, and γ-chloropropyl trimethoxy silane. Examples of the titanate-based coupling agent include isopropyl triisostearoyl titanate, isopropyl tridecyl benzene sulfonyl titanate, isopropyl tris(dioctyl pyrophosphate)titanate, tetraisopropyl bis(dioctyl phosphite)titanate, tetra(2,2-diallyloxymethyl-1-butyl)bis(di-tridecyl) phosphite titanate, bis(dioctyl pyrophosphate)oxyacetate titanate, bis(dioctyl pyrophosphate)ethylene titanate, isopropyl trioctanoyl titanate, and isopropyl tricumyl phenyl titanate.

The coupling agent may be preferably a silane-based coupling agent, more preferably an aminosilane-based coupling agent, for example, γ-aminopropyl-triethoxy silane, N-β-(aminoethyl)-γ-aminopropyl-triethoxy silane, N-(aminocarbonyl)-γ-aminopropyl triethoxy silane, N-[β-(phenylamino)- ethyl]-γ-aminopropyl triethoxy silane, N-phenyl-γ-aminopropyl triethoxy silane, or N-phenyl-γ-aminopropyl trimethoxy silane. Among them, N-phenyl-γ-aminopropyl trimethoxy silane is particularly preferred.

Examples of the solvent for the solution of a surface treatment agent such as a coupling agent and a chelating agent may include those listed as the organic solvent for the polyimide precursor solution (the solvent contained in the self-supporting film). A preferable organic solvent may be compatible with the polyimide precursor solution, and may be the same as the organic solvent for the polyimide precursor solution. The organic solvent may be a mixture of two or more compounds.

The content of the surface treatment agent (e.g. a coupling agent and a chelating agent) in the organic solvent solution may be preferably 0.5 wt % or more, more preferably 1 wt % to 100 wt %, particularly preferably 3 wt % to 60 wt %, further preferably 5 wt % to 55 wt %. The content of water in the surface treatment agent solution may be preferably 20 wt % or less, more preferably 10 wt % or less, particularly preferably 5 wt % or less. A solution of a surface treatment agent in an organic solvent may preferably have a rotational viscosity (solution viscosity measured with a rotation viscometer at a temperature of 25° C.) of 10 to 50,000 centipoise.

A particularly preferable solution of a surface treatment agent in an organic solvent may comprise a surface treatment agent, which is homogeneously dissolved in an amide solvent, in an amount of 0.5 wt % or more, particularly preferably 1 wt % to 60 wt %, further preferably 3 wt % to 55 wt %, and have a low viscosity (specifically, rotational viscosity: 10 to 5,000 centipoise).

The amount of the surface treatment agent solution to be applied may be appropriately determined, and may be preferably 1 g/m$^2$ to 50 g/m$^2$, more preferably 2 g/m$^2$ to 30 g/m$^2$, particularly preferably 3 g/m$^2$ to 20 g/m$^2$, for example. The amount of the surface treatment agent solution to be applied to one side may be the same as, or different from the amount of the surface treatment agent solution to be applied to the other side.

The solution of the surface treatment agent may be applied by any known method; for example, by gravure coating, spin coating, silk screen coating, dip coating, spray coating, bar coating, knife coating, roll coating, blade coating, and die coating and the like.

According to the present invention, the self-supporting film on which a surface treatment agent solution is applied, as necessary, is then heated to effect imidization, thereby producing a polyimide film. And then, the polyimide film thus obtained is subjected to heat treatment (hereinafter, also referred to as "additional heat treatment") in which the polyimide film is heated at a temperature of from 460° C. to 550° C.

The suitable heat treatment for imidization may be a process in which polymer imidization and solvent evaporation/removal are gradually conducted at about 100 to 400° C. for about 0.05 to 5 hr., particularly preferably 0.1 to 3 hr. as the first step. This heat treatment is particularly preferably conducted stepwise, that is, the first heat treatment at a relatively low temperature of about 100 to 170° C. for about 0.5 to 30 min, then the second heat treatment at a temperature of 170 to 220° C. for about 0.5 to 30 min, and then the third heat treatment at a high temperature of 220 to 400° C. for about 0.5 to 30 min. As necessary, the fourth high-temperature heat treatment at a high temperature of 400 to 550° C. may be conducted.

It is preferred that during heat treatment for imidization, at least both edges of a long solidified film in the direction perpendicular to the length direction, i.e. in the width direction, are fixed with a pin tenter, a clip or a frame, for example, and the solidified film is stretched and/or shrunk in the width direction, as necessary, in a curing oven.

According to the present invention, a polyimide film may be prepared by chemical imidization, or a combination of thermal imidization and chemical imidization, as well as by thermal imidization. The chemical imidization may be conducted according to a known method. For example, the chemical imidization may be conducted using a dehydrating agent such as acetic anhydride, and a catalyst such as pyridine, α-picoline, β-picoline and isoquinoline.

According to the present invention, the polyimide film thus obtained is heated at a temperature of from 460° C. to 550° C., preferably at a temperature equal to or higher than 460° C. and lower than 520° C. (additional heat treatment).

The heating temperature in the additional heat treatment is within a range of from 460° C. to 550° C., and may be appropriately selected depending on the composition of the polyimide, the thickness of the film, and the like. The heating temperature may be preferably 470° C. or higher, more preferably 480° C. or higher, further preferably 490° C. or higher, particularly preferably 500° C. or higher. Meanwhile, the heating temperature may be preferably lower than 520° C. When the heating temperature is lower than 460° C., the obtained polyimide film may not have improved adhesiveness. When the heating temperature is 550° C. or higher, the properties of the obtained polyimide film may be impaired. The heating temperature may not be kept constant.

The additional heat treatment time (time period for which a polyimide film is heated at a temperature of from 460° C. to 550° C.) may be appropriately selected depending on the intended use, and may be preferably from 5 sec. to 30 min, more preferably from 10 sec. to 10 min, particularly preferably from 20 sec. to 5 min. When the additional heat treatment time is excessively short, the obtained polyimide film may not have improved adhesiveness. When the additional heat treatment time is excessively long, the properties of the obtained polyimide film may be impaired.

The heat treatment may be conducted in a batch mode or in a continuous mode. In the additional heat treatment, the polyimide film may be fixed with a pin tenter, a clip or a frame, for example, while heating the polyimide film.

In the present invention, a surface of the polyimide film is further treated by spraying water or an alkaline aqueous solution on one side or both sides of the polyimide film.

Examples of the alkaline aqueous solution include, but not limited to, aqueous solutions of alkali metal hydroxides and alkaline earth metal hydroxides such as sodium hydroxide and potassium hydroxide; aqueous solutions of alkali metal carbonates and alkaline earth metal carbonates such as sodium carbonate and potassium carbonate; and aqueous solutions of alkali metal hydrogencarbonate and alkaline earth metal hydrogencarbonate such as sodium hydrogencarbonate and potassium hydrogencarbonate. An aqueous solution of sodium hydroxide, an aqueous solution of sodium carbonate, or an aqueous solution of sodium hydrogencarbonate may be particularly suitably used. These metal hydroxides and metal salts may be used alone or in combination of two or more. An aqueous solution of an organic base may be also used.

The concentration (content of metal hydroxide and/or metal salt) of the alkaline aqueous solution may be 0 wt % or more, and may be preferably from 0.1 wt % to 50 wt %, more preferably from 0.2 wt % to 10 wt %, particularly preferably from 0.3 wt % to 5 wt %. When the concentration of the alkaline aqueous solution is 0.1 wt % or more, the obtained polyimide film may have remarkably improved adhesiveness. When the concentration of the alkaline aqueous solution is more than 50 wt %, the properties of the obtained polyimide film may be impaired.

The alkaline aqueous solution may contain other component(s), as long as the effect of the present invention would not be impaired.

The temperature of water or the alkaline aqueous solution to be sprayed on the polyimide film surface may be preferably, but not limited to, from 5° C. to 80° C., more preferably from 10° C. to 60° C., particularly preferably from 15° C. to 50° C. When the temperature of water or the alkaline aqueous solution is lower than 5° C., the obtained polyimide film may not have improved adhesiveness. When the temperature of water or the alkaline aqueous solution is higher than 80° C., the properties of the obtained polyimide film may be impaired.

The time period for which water or an alkaline aqueous solution is sprayed on a surface of the polyimide film (spray treatment time) may be appropriately selected depending on the intended use. The most suitable spray treatment time may vary depending on the temperature and the concentration of water or the alkaline aqueous solution. In general, the spray treatment time may be preferably from 1 sec. to 5 min, more preferably from 2 sec. to 3 min, particularly preferably from 2 sec. to 2 min. When the spray treatment time is excessively short, the obtained polyimide film may not have improved adhesiveness. When the spray treatment time is excessively long, the properties of the obtained polyimide film may be impaired.

Water or an alkaline aqueous solution may be sprayed, for example, from a spray nozzle on a surface of the polyimide film.

Examples of the spray nozzle to be used include a flat type, a uniform-flat type, a solid type, a full-cone type, a hollow-cone type and a fine-spray type.

The spray pressure may be appropriately selected depending on the intended use. In general, the spray pressure may be preferably from 0.03 MPa to 25 MPa, more preferably from 0.05 MPa to 10 MPa, particularly preferably from 0.1 MPa to 1 MPa. When the spray pressure is excessively low, the obtained polyimide film may not have improved adhesiveness. When the spray pressure is excessively high, the polyimide film may be torn.

The distance between the spray nozzle and the film may be appropriately selected depending on the intended use, and may be preferably from 1 cm to 50 cm, for example, for the spray treatment.

One nozzle, or two or more nozzles may be preferably positioned to treat the whole surface of the film uniformly.

As necessary, water or an alkaline aqueous solution may be sprayed on one side of the polyimide film, or alternatively, may be sprayed on both sides of the polyimide film. When both sides of the polyimide film are subjected to the spray treatment, both sides of the polyimide film may be treated simultaneously, or alternatively, one side of the polyimide film may be treated, and then the other side may be treated. In addition, both sides of the polyimide film may be sprayed with the same solution (water or an alkaline aqueous solution) or different solutions.

In the case where the surface of the polyimide film is treated with water, the polyimide film may be dried without any other treatment after the spray treatment. In the case where the surface of the polyimide film is treated with an alkaline aqueous solution, the polyimide film may be generally dried after the polyimide film surface is treated with water, an acid, and then water so as to remove the remaining metal ion in or on the film. The remaining metal ion may reduce electrical insulation.

Each of these cleanings with water, an acid, and water may be conducted in the same way as the spray treatment with water or an alkaline aqueous solution as described above.

Examples of the acid to be used in the cleaning with acid include dilute sulfuric acid and dilute hydrochloric acid. The concentration and the temperature of the acid, and the treatment time may be appropriately selected depending on the intended use. The cleaning with acid may be preferably conducted, for example, under the conditions where the concentration of the acid is from 0.5 wt % to 5 wt %, the temperature of the acid is from 5° C. to 60° C., and the treatment time is from 1 sec. to 5 min.

The spray treatments with an alkaline aqueous solution, water, an acid, and water may be conducted in a batch mode or in a continuous mode. Separate polyimide films which are fixed with plastic frames, for example, or a long polyimide film (in a roll-to-roll process) may be conveyed into spray chambers connected in series, to conduct the spray treatments in a continuous mode. A drying chamber may be connected to the last chamber for water washing so that the drying, in addition to the spray treatments, may be conducted in a continuous mode.

In the case where the surface of the polyimide film is treated with water, the spray treatment with water and the drying may be conducted in a continuous mode likewise.

The polyimide film may be dried, for example, using a hot-air oven or a heater.

According to the present invention, in view of few steps in the process and high productivity, the surface of the polyimide film may be treated with water.

The thickness of the polyimide film of the present invention may be, but not limited to, from about 3 µm to about 250 µm, preferably from about 4 µm to about 150 µm, more preferably from about 5 µm to about 125 µm, particularly preferably from about 5 um to about 100 µm. In general, a thin polyimide film, for example, having a thickness of 12.5 µm or less may not have adequate adhesiveness. According to the present invention, however, there may be provided a polyimide film exhibiting excellent adhesiveness and having a thickness of 12.5 µm or less, preferably 10 µm or less, more preferably 8 µm or less, further preferably 7 µm or less, particularly preferably 6 µm or less.

The polyimide film of the present invention thus obtained may have improved adhesiveness, specifically adhesiveness to an adhesive, and exhibit excellent adhesiveness after heat treatment, e.g. after heat treatment at 150° C. for 24 hr., even though a coupling agent is not used for the production of the polyimide film. The polyimide film of the present invention may exhibit excellent adhesiveness in the initial state (before heat treatment) and after heat treatment (heat-resistance test) at 150° C. for 24 hr., specifically the 90° peel strengths between a coverlay and the polyimide film of the present invention in the initial state (before heat treatment) and after heat treatment (heat-resistance test) at 150° C. for 24 hr. may be 0.3 N/mm or more, preferably 0.4 N/mm or more, even though a coupling agent is not used for the production of the polyimide film. A coverlay may be a laminate wherein an epoxy adhesive or an acrylic adhesive, which is generally semi-cured, is laminated on a polyimide film or a polyethylene terephthalate film. Examples of the coverlay include "coverlay (general type) (product name) CV (product number) series" and "anti-migration coverlay (product name) CF, CT (product number) series" made by Arisawa Mfg. Co., Ltd.; "TFA 560 series (product name)" and "TFA 577 series (product name)" made by KYOCERA Chemical Corporation; "Pyralux LF/FR series (product name)" made by Du Pont; "NIKAFLEX CTSV series (product name)", "NIKAF- LEX CISV series (product name)", "NIKAFLEX CISA series (product name)", "NIKAFLEX CKSE series (product name)", "NIKAFLEX CISG series (product name)" and "NIKAFLEX CKSG series (product name)" made by NIKKAN INDUSTRIES Co., Ltd.; and "FHK series (product name)", "FD series (product name)" and "FI series (product name)" made by Taiflex Scientific Co., Ltd.

Using the polyimide film of the present invention, a polyimide film having an adhesive, a photosensitive material, a thermocompression-bondable material and the like (laminated on the polyimide film) may be obtained.

A polyimide film which is prepared according to the present invention may have improved adhesiveness, sputtering properties, and metal vapor deposition properties. Therefore, a metal foil such as a copper foil may be attached onto the polyimide film with an adhesive, or alternatively, a metal layer such as a copper layer may be formed on the polyimide film by a metalizing method such as sputtering and metal vapor deposition, to provide a metal-laminated polyimide film such as a copper-laminated polyimide film having excellent adherence and sufficiently high peel strength. In addition, a metal foil such as a copper foil may be laminated on a polyimide film which is prepared according to the present invention, using a thermocompression-bondable polymer such as a thermocompression-bondable polyimide, to provide a metal foil-laminated polyimide film. A metal layer may be laminated on a polyimide film by a known method.

The thickness of the copper layer in the copper-laminated polyimide film may be appropriately selected depending on the intended use, and may be preferably from about 1 µm to about 50 µm, more preferably from about 2 µm to about 20 µm.

The type and thickness of the metal foil, which is attached onto the polyimide film with an adhesive, may be appropriately selected depending on the intended use. Specific examples of the metal foil include a rolled copper foil, an electrolytic copper foil, a copper alloy foil, an aluminum foil, a stainless foil, a titanium foil, an iron foil and a nickel foil. The thickness of the metal foil may be preferably from about 1 µm to about 50 µm, more preferably from about 2 µm to about 20 µm.

Another resin film, a metal such as copper, a chip member such as an IC chip, or the like may be attached with an adhesive onto a polyimide film which is prepared according to the present invention.

Any known adhesive, including an adhesive having excellent insulating properties and excellent adhesion reliability, or an adhesive having excellent conductivity and excellent adhesion reliability such as an ACF, which is bonded by pressure, may be used depending on the intended use. A thermoplastic adhesive or a thermosetting adhesive may be used.

Examples of the adhesive include polyimide adhesives, polyamide adhesives, polyimide-amide adhesives, acrylic adhesives, epoxy adhesives, urethane adhesives, and adhesives containing two or more thereof. An acrylic adhesive, an epoxy adhesive, a urethane adhesive, or a polyimide adhesive may be particularly suitably used.

The metalizing method is a method for forming a metal layer, which is different from metal plating and metal foil lamination, and any known method such as vacuum vapor deposition, sputtering, ion plating and electron-beam evaporation may be employed.

Examples of the metal to be used in the metalizing method include, but not limited to, metals such as copper, nickel, chromium, manganese, aluminum, iron, molybdenum, cobalt, tungsten, vanadium, titanium and tantalum, and alloys thereof, and metal compounds such as oxides and carbides of these metals. The thickness of the metal layer formed by a metalizing method may be appropriately selected depending on the intended use, and may be preferably from 1 nm to 500 nm, more preferably from 5 nm to 200 nm for a practical use. The number of metal layers formed by a metalizing method may be appropriately selected depending on the intended use, and may be one, two, multi such as three or more layers.

A metal-plated layer such as a copper-plated layer and a tin-plated layer may be formed by a known wet plating process such as electrolytic plating and electroless plating on the surface of the metal layer of the metal-laminated polyimide film, which is produced by a metalizing method. The thickness of the metal-plated layer such as a copper-plated layer may be preferably from 1 µm to 40 µm for a practical use.

According to the present invention, a copper-laminated polyimide film having a 90° peel strength of 0.3 N/mm or higher, further 0.4 N/mm or higher, particularly 0.5 N/mm or higher, for example, may be obtained without using a coupling agent for the production of a polyimide film.

The polyimide film of the present invention may be suitably used as an insulating substrate material for FPC, TAB, COF, a metal-wiring board and the like, a cover material for a metal wiring, a chip such as an IC chip and the like, and a base material for a liquid crystal display, an organic electroluminescent display, an electronic paper, a solar cell and the like.

In such applications, it is generally preferred that a polyimide film has a coefficient of thermal expansion close to that of copper. Specifically, a polyimide film may preferably have a coefficient of thermal expansion (both MD and TD) of 10 to 40 ppm/° C., more preferably 11 to 30 ppm/° C., particularly preferably 12 to 25 ppm/° C. According to the present invention, there may be provided a polyimide film having excellent adhesiveness and a coefficient of thermal expansion close to that of copper.

In some applications such as COF and interposer, it is preferred that a polyimide film has a coefficient of thermal expansion close to that of glass and silicon. According to the present invention, there may be provided a polyimide film having a coefficient of thermal expansion of 0 to 10 ppm/° C.

EXAMPLES

The present invention will be described in more detail below with reference to the Examples. However, the present invention is not limited to these Examples.

The adhesive strength of a polyimide film to a coverlay (coverlay adhesive strength) was determined as follows.

A coverlay CVA0525KA made by Arisawa Mfg. Co., Ltd. was laminated on the obtained polyimide film by pressing at a temperature of 180° C. and a pressure of 3 MPa for 30 min. The 90° peel strength of the laminate thus obtained was measured at a peel speed of 50 mm/min. This measured 90° peel strength was referred to as "initial adhesive strength".

In addition, after the coverlay was laminated on the polyimide film, the laminate obtained was heated in a hot-air dryer at 150° C. for 24 hr. Then, the 90° peel strength of the laminate was measured in the same way and this measured 90° peel strength was referred to as "adhesive strength after heat-resistance test".

The air side when the polyimide precursor solution was cast on the metal support in the production of the polyimide film was taken as Side A of the film, while the metal support side was taken as Side B of the film.

Production Example 1

Into a polymerization tank were placed the predetermined amounts of N,N-dimethylacetamide and p-phenylenediamine (PPD). And then, while stirring at a temperature of 40° C., 3,3',4,4'-biphenyltetracarboxylic dianhydride (s-BPDA) was stepwise added to the resulting mixture until the molar amount of s-BPDA was substantially equal to the molar amount of PPD, and reacted, to provide a polyamic acid solution (polyimide precursor solution) having a solid content of 18 wt %. To the polyamic acid solution were added 0.25 parts by weight of triethanolamine salt of monostearyl phosphate and 0.3 parts by weight of colloidal silica relative to 100 parts by weight of the polyamic acid, and the resulting mixture was homogeneously mixed. The polyamic acid solution composition thus obtained had a rotational viscosity at 30° C. of 180 Pa·s.

To the polyamic acid solution composition was added 0.05 equivalents of 1,2-dimethylimidazole relative to the amide acid unit. And then, the polyamic acid solution composition was continuously cast from a slit of a T-die mold on a smooth metal support in a drying oven, to form a thin film. The thin film was heated at a temperature of 150° C. for a predetermined time, and then peeled off from the support, to provide a self-supporting film. The self-supporting film thus obtained had a weight loss on heating of 27.7 wt %, a Side A imidization rate of 17.9% and a Side B imidization rate of 29.3%.

And then, the self-supporting film was fed into a continuous heating oven (curing oven) while fixing both edges of the film in the width direction, and the film was heated in the oven from 100° C. to the highest heating temperature of 450° C. to effect imidization, thereby producing a long polyimide film (PI-1) having an average thickness of about 13 μm.

Production Example 2

A long polyimide film (PI-2) having an average thickness of 5 μm was produced in the same way as in Production Example 1, except that the highest heating temperature in the continuous heating oven was 480° C. and the amount of 1,2-dimethylimidazole added to the polyamic acid solution composition was 0.15 equivalents relative to the amide acid unit. The self-supporting film thus obtained had a weight loss on heating of 27.7 wt %, a Side A imidization rate of 17.9% and a Side B imidization rate of 29.3%.

Comparative Example 1

The coverlay adhesive strength of the polyimide film (PI-1) obtained in Production Example 1 was determined. The results are shown in Table 1.

Comparative Example 2

The polyimide film (PI-1) obtained in Production Example 1 was heated in a heating oven at 500° C. for 2 min (as additional heat treatment), while fixing all edges of the film to a metal frame with a clip. And then, the coverlay adhesive strength of the polyimide film was determined. The results are shown in Table 1.

Example 1

The polyimide film (PI-1) obtained in Production Example 1 was heated in a heating oven at 500° C. for 2 min (as additional heat treatment), while fixing all edges of the film to a metal frame with a clip. And then, while fixing all edges of the film to a plastic frame with an adhesive tape, the film was subjected to spray treatment and dried, using a continuous apparatus consisting of a sodium hydroxide aqueous solution (1.7 wt %) chamber, a recovered water chamber, a sulfuric acid (5 wt %) chamber, a recovered water chamber, a recovered water chamber, a pure water chamber and a drying chamber. In the sodium hydroxide aqueous solution chamber, 1.7 wt % sodium hydroxide aqueous solution was sprayed from a full-cone type spray nozzle at a solution temperature of 40° C. and a spray pressure of 0.2 MPa. In the other chambers, recovered water, pure water or 5 wt % sulfuric acid was sprayed from a flat type spray nozzle at room temperature and a spray pressure of 0.1 MPa. In the drying chamber, the polyimide film was dried at a temperature of 50° C. The residence time in the sodium hydroxide aqueous solution chamber (spray treatment time) was 30 sec. And then, the coverlay adhesive strength of the polyimide film was determined. The results are shown in Table 1.

Comparative Example 3

The polyimide film (PI-1) obtained in Production Example 1 was subjected to spray treatment and dried in the same way as in Example 1, without conducting the additional heat treatment at 500° C. for 2 min. And then, the coverlay adhesive strength of the polyimide film was determined. The results are shown in Table 1.

Comparative Example 4

The polyimide film (PI-1) obtained in Production Example 1 was heated in a heating oven at 480° C. for 2 min (as additional heat treatment), while fixing all edges of the film to a metal frame with a clip. And then, at a temperature of 23° C., the film was immersed in 5 wt % sodium hydroxide aqueous solution for 5 min, washed with water, immersed in 1 wt % sulfuric acid for 2 min, washed with water, and dried. And then, the coverlay adhesive strength of the polyimide film was determined. The results are shown in Table 1.

Example 2

The polyimide film (PI-1) obtained in Production Example 1 was heated in a heating oven at 500° C. for 2 min (as additional heat treatment), while fixing all edges of the film to a metal frame with a clip. And then, while fixing all edges of the film to a plastic frame with an adhesive tape, the film was subjected to spray treatment and dried, using a continuous apparatus consisting of a 0.44 wt % sodium carbonate aqueous solution chamber, a recovered water chamber, a recovered water chamber, a pure water chamber and a drying chamber. In the sodium carbonate aqueous solution chamber, 0.44 wt % sodium carbonate aqueous solution was sprayed from a full-cone type spray nozzle at a solution temperature of 30° C. and a spray pressure of 0.2 MPa. In the other chambers, recovered water or pure water was sprayed from a flat type spray nozzle at room temperature and a spray pressure of 0.1 MPa. In the drying chamber, the polyimide film was dried at a temperature of 50° C. The residence time in the sodium carbonate aqueous solution chamber (spray treatment time) was 13.5 sec. And then, the coverlay adhesive strength of the polyimide film was determined. The results are shown in Table 1.

Comparative Example 5

The polyimide film (PI-1) obtained in Production Example 1 was subjected to spray treatment and dried in the same way as in Example 2, without conducting the additional heat treatment at 500° C. for 2 min. And then, the coverlay adhesive strength of the polyimide film was determined. The results are shown in Table 1.

Example 3

The polyimide film (PI-1) obtained in Production Example 1 was heated in a heating oven at 500° C. for 2 min (as additional heat treatment), while fixing all edges of the film to a metal frame with a clip. And then, while fixing all edges of the film to a plastic frame with an adhesive tape, the film was subjected to spray treatment and dried, using a continuous apparatus consisting of a pure water chamber and a drying chamber. In the pure water chamber, pure water was sprayed from a flat type spray nozzle at room temperature and a spray pressure of 0.1 MPa. In the drying chamber, the polyimide film was dried at a temperature of 50° C. The residence time in the pure water chamber (spray treatment time) was 6 sec. And then, the coverlay adhesive strength of the polyimide film was determined. The results are shown in Table 1.

Comparative Example 6

The polyimide film (PI-1) obtained in Production Example 1 was subjected to spray treatment and dried in the same way as in Example 3, without conducting the additional heat treatment at 500° C. for 2 min. And then, the coverlay adhesive strength of the polyimide film was determined. The results are shown in Table 1.

Comparative Example 7

The coverlay adhesive strength of the polyimide film (PI-2) obtained in Production Example 2 was determined. The results are shown in Table 1.

Example 4

The polyimide film (PI-2) obtained in Production Example 2 was subjected to additional heat treatment at 500° C. for 2 min and spray treatment, including spray treatment with 1.7 wt % sodium hydroxide aqueous solution for 30 sec., and dried in the same way as in Example 1. And then, the coverlay adhesive strength of the polyimide film was determined. The results are shown in Table 1.

Comparative Example 8

The polyimide film (PI-2) obtained in Production Example 2 was subjected to spray treatment and dried in the same way as in Example 4, without conducting the additional heat treatment. And then, the coverlay adhesive strength of the polyimide film was determined. The results are shown in Table 1.

(1) As can be seen from the comparison of Examples 1, 2 and Comparative Example 1, when a polyimide film is subjected to the additional heat treatment in which the polyimide film is heated at a temperature of 480° C. or higher, and then the spray treatment in which a sodium hydroxide aqueous solution or a sodium carbonate aqueous solution is sprayed on the polyimide film, both the initial adhesive strength and the adhesive strength after heat-resistance test are enhanced.

In addition, as can be seen from the comparison of Example 3 and Comparative Example 1, when a polyimide film is subjected to the additional heat treatment in which the polyimide film is heated at a temperature of 480° C. or higher, and then the spray treatment in which pure water is sprayed on the polyimide film, both the initial adhesive strength and the adhesive strength after heat-resistance test are enhanced.

In contrast, as can be seen from the comparison of Comparative Example 1 and Comparative Example 2, when a polyimide film is not subjected to spray treatment with a sodium hydroxide aqueous solution, a sodium carbonate aqueous solution nor pure water, both the initial adhesive strength and the adhesive strength after heat-resistance test are low.

As can be seen from the comparison of Comparative Example 1 and Comparative Examples 3, 5 and 6, when a polyimide film is subjected to the spray treatment with a sodium hydroxide aqueous solution, a sodium carbonate aqueous solution or pure water, but is not subjected to the additional heat treatment, the adhesive strength after heat-resistance test is low, although the initial adhesive strength is enhanced in some cases.

In addition, as can be seen from Comparative Example 4, when a polyimide film is immersed in a sodium hydroxide aqueous solution, instead of spray treatment, the adhesive strength after heat-resistance test is low, although the initial adhesive strength is enhanced.

(2) As can be seen from the comparison of Example 4 and Comparative Example 7, in the case of a thin polyimide film

TABLE 1

| | Film | The highest heating temperature in imidization | Additional heat treatment | Spray treatment | Coverlay adhesive strength (N/mm) | | | |
|---|---|---|---|---|---|---|---|---|
| | | | | | Side A Initial | Side A After heat-resistance test | Side B Initial | Side B After heat-resistance test |
| Comparative Example 1 | PI-1 (s-BPDA/PPD; 13 μm) | 450° C. | Not conducted | Not conducted | 0.36 | 0.34 | 0.39 | 0.29 |
| Comparative Example 2 | PI-1 (s-BPDA/PPD; 13 μm) | 450° C. | 500° C., 2 min | Not conducted | 0.33 | 0.37 | 0.30 | 0.24 |
| Example 1 | PI-1 (s-BPDA/PPD; 13 μm) | 450° C. | 500° C., 2 min | NaOH, 30 sec | 1.77 | 0.53 | 1.77 | 0.46 |
| Comparative Example 3 | PI-1 (s-BPDA/PPD; 13 μm) | 450° C. | Not conducted | NaOH, 30 sec | 1.77 | 0.35 | 0.99 | 0.24 |
| Comparative Example 4 | PI-1 (s-BPDA/PPD; 13 μm) | 450° C. | 480° C., 2 min | NaOH (dip), 5 min | 1.78 | 0.35 | 1.86 | 0.34 |
| Example 2 | PI-1 (s-BPDA/PPD; 13 μm) | 450° C. | 500° C., 2 min | Na$_2$CO$_3$, 13.5 sec | 0.54 | 0.52 | 0.51 | 0.44 |
| Comparative Example 5 | PI-1 (s-BPDA/PPD; 13 μm) | 450° C. | Not conducted | Na$_2$CO$_3$, 13.5 sec | 0.47 | 0.35 | 0.52 | 0.22 |
| Example 3 | PI-1 (s-BPDA/PPD; 13 μm) | 450° C. | 500° C., 2 min | Pure water, 6 sec | 0.46 | 0.73 | 0.48 | 0.50 |
| Comparative Example 6 | PI-1 (s-BPDA/PPD; 13 μm) | 450° C. | Not conducted | Pure water, 6 sec | 0.39 | 0.33 | 0.45 | 0.26 |
| Comparative Example 7 | PI-2 (s-BPDA/PPD; 5 μm) | 480° C. | Not conducted | Not conducted | 0.19 | 0.12 | 0.22 | 0.14 |
| Example 4 | PI-2 (s-BPDA/PPD; 5 μm) | 480° C. | 500° C., 2 min | NaOH, 30 sec | 0.98 | 0.42 | 0.83 | 0.46 |
| Comparative Example 8 | PI-2 (s-BPDA/PPD; 5 μm) | 480° C. | Not conducted | NaOH, 30 sec | 0.46 | 0.11 | 0.91 | 0.13 |

The results of Examples and Comparative Examples shown in Table 1 indicate the following matters:

of s-BPDA/PPD having an average thickness of 5 μm, when the polyimide film is subjected to the additional heat treatment in which the polyimide film is heated at a temperature of 480° C. or higher, and then the spray treatment in which a sodium hydroxide aqueous solution is sprayed on the polyimide film, both the initial adhesive strength and the adhesive strength after heat-resistance test are enhanced.

In contrast, as can be seen from the comparison of Comparative Example 7 and Comparative Example 8, when the polyimide film is subjected to the spray treatment with a sodium hydroxide aqueous solution, but is not subjected to the additional heat treatment, the adhesive strength after heat-resistance test is low, although the initial adhesive strength is enhanced.

INDUSTRIAL APPLICABILITY

As described above, according to the present invention, the adhesiveness may be easily improved in a polyimide film prepared from a tetracarboxylic acid component comprising 3,3',4,4'-biphenyltetracarboxylic dianhydride as the main component and a diamine component comprising p-phenylenediamine as the main component.

The polyimide film of the present invention may exhibit excellent adhesiveness, and may be suitably used as an insulating substrate material for FPC, TAB, COF, a metal-wiring board and the like, a cover member for a metal wiring, a chip such as an IC chip and the like, and a base material for a liquid crystal display, an organic electroluminescent display, an electronic paper, a solar cell and the like.

The invention claimed is:

1. A process for producing a polyimide film, comprising:
    flow-casting a solution of a polyamic acid or a polyimide, which is prepared by reacting a tetracarboxylic acid component comprising 3,3',4,4'-biphenyltetracarboxylic dianhydride as the main component and a diamine component comprising p-phenylenediamine as the main component, on a support, and drying the solution to form a self-supporting film;
    heating the self-supporting film to provide a polyimide film;
    heating the resulting polyimide film at a temperature of 460° C. to 550° C.; and
    spraying pure water on a surface of the heat-treated polyimide film.

2. The process for producing a polyimide film of claim 1, wherein a solution of a polyamic acid or a polyimide, which is flow-cast on a support, is heated at a temperature of 100° C. to 180° C. to form a self-supporting film having a weight loss on heating within a range of 20 wt % to 50 wt % and an imidization rate within a range of 8% to 55% by thermal imidization.

3. The process for producing a polyimide film of claim 1, wherein the polyimide film is produced without using a coupling agent.

4. The process for producing a polyimide film of claim 1, wherein pure water is sprayed from a spray nozzle on a surface of the polyimide film at a spray pressure of 0.03 MPa to 25 MPa.

5. The process for producing a polyimide film of claim 1, wherein pure water is sprayed from a spray nozzle on a surface of the polyimide film, wherein the distance between the spray nozzle and the polyimide film is 1 cm to 50 cm.

* * * * *